United States Patent
Pawlak

(10) Patent No.: US 10,128,114 B2
(45) Date of Patent: Nov. 13, 2018

(54) AMORPHIZATION INDUCED METAL-SILICON CONTACT FORMATION

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 428 days.

(21) Appl. No.: 14/874,623

(22) Filed: Oct. 5, 2015

(65) Prior Publication Data
US 2017/0098544 A1    Apr. 6, 2017

(51) Int. Cl.
*H01L 21/265*    (2006.01)

(52) U.S. Cl.
CPC .............................. *H01L 21/26506* (2013.01)

(58) Field of Classification Search
CPC ..................................................... H01L 21/265
See application file for complete search history.

(56) References Cited

U.S. PATENT DOCUMENTS

2012/0021584 A1*  1/2012  Wang ................. H01L 29/0847
                                                                   438/301

OTHER PUBLICATIONS

Liu et al., "A Low Thermal Budget Self-Aligned Ti Silicide Technology Using Germanium Implantation for Thin-Film SOI MOSFET's", IEEE Transactions on Electron Devices, vol. 45, No. 6, Jun. 1998, 7 Pages.
Vandervorst et al., "Athermal germanium migration in strained silicon layers during junction formation with solid-phase epitaxial regrowth", Applied Physics Letters, vol. 86, No. 8, Feb. 18, 2005, 4 Pages.

* cited by examiner

*Primary Examiner* — Marvin Payen
(74) *Attorney, Agent, or Firm* — Ditthavong & Steiner, P.C.

(57) ABSTRACT

A method of forming a metal-silicon contact is provided. Embodiments include forming a metal layer over a substrate; forming an amorphous silicon (a-Si) capping layer over the metal layer; implanting ions to induce an athermal migration of the a-Si capping layer into the metal layer; and annealing the metal layer and the a-Si capping layer to form a metal silicide layer over the substrate.

17 Claims, 5 Drawing Sheets

AMORPHIZATION INDUCED METAL-SILICON CONTACT FORMATION

TECHNICAL FIELD

The present disclosure relates to the manufacture of semiconductor devices including the formation of metal-silicon (Si) contacts. In particular, the present disclosure relates to forming metal-Si contacts used in manufacturing a semiconductor device in the 28 nanometer (nm) technology node and beyond.

BACKGROUND

As technology nodes continue to advance and decrease in size, they provide continuously less space for contacting on source and drain regions. Resistive losses become a principle challenge in complementary metal-oxide semiconductor (CMOS) transistor performance. That is, as more and more transistors are provided on smaller surfaces, the resistance increases. With conventional techniques, ion implantation into a Si substrate is performed followed by deposition of a metal layer, and then a thermal annealing of the metal and Si substrate to form a metal silicide. However, resistance losses remain a challenge and additional approaches are needed. The main challenge relates to a reduction of available space for making a metal-semiconductor contact and therefore new methods are needed to lower the contact resistance.

A need therefore exists for methodology enabling formation of a low resistive metal-Si contact and resulting devices with improved transistor performance such as on-state current.

SUMMARY

An aspect of the present disclosure is amorphization induced metal-Si contact formation at lower thermal budget (T) and lower sheet resistance ($R_c$). Another aspect includes the silicidation step beginning with a mutual cross-diffusion of semiconductor and metal elements. The amorphized semiconductor and metal materials have a lower temperature for inter-diffusion. Further, ion implantation related amorphization through a Si-capped metal layer induces athermal layer mixing as a relevant onset for the silicide layer. The ion implantation intermixes the layers which facilitate the silicidation during thermal annealing. Additional aspects include the formation of multiple metal layers which enhances the possibility to further lower T and Rs of the layers at the contact site.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a metal layer over a substrate; forming an amorphous silicon (a-Si) capping layer over the metal layer; implanting ions to induce an athermal migration of the a-Si capping layer into the metal layer; and annealing the metal layer and the a-Si capping layer to form a metal silicide layer over the substrate.

Aspects of the present disclosure include removing any remaining portion of the metal layer which was not converted into the metal silicide during annealing. Other aspects include the substrate being a bulk Si substrate including Si, silicon germanium (SiGe) or germanium (Ge). Further aspects include implanting Ge, germanium difluoride ($GeF_2$), or Si at an energy of 3 to 10 kilo electron volts (keV) and a dose of 3e14 to 1e16 atoms/cm$^2$. Other aspects include implanting arsenide (As) or phosphorus (P) ions for N-type semiconductor contacts, or implanting difluoroboryl ($BF_2$) for P-type semiconductor contacts. Still further aspects include forming a nickel (Ni), titanium (Ti) or nickel platinum (NiPt) layer over the substrate. Additional aspects include forming a second metal layer over the a-Si capping layer prior to implanting the ions, wherein the second metal layer includes Ni, Ti, or NiPt. Yet another aspect includes forming a second a-Si capping layer over the second metal layer. Further aspects include forming the a-Si capping layer with plasma-enhanced chemical vapor deposition (PECVD). Other aspects include annealing the metal layer and the a-Si capping layer at 400 to 700° C. Yet further aspects include annealing the metal layer and the a-Si capping layer for 20 to 120 seconds. Additional aspects include forming the metal layer and the a-Si capping layer to a combined thickness of 1 to 5 nm.

Another aspect of the present disclosure is a method including forming a first metal layer over a substrate; forming a first a-Si capping layer over the first metal layer; forming a second metal layer over the first a-Si capping layer; forming a second a-Si capping layer over the second metal layer; implanting ions to induce an athermal migration of the first and second a-Si capping layers into the first and second metal layers, respectively; and annealing the first and second metal layers and the first and second a-Si capping layers to form a metal silicide layer over the substrate.

Aspects include the substrate being a bulk Si substrate including Si, SiGe or Ge. Another aspect includes implanting Ge, $GeF_2$, or Si at an energy of 3 to 10 keV and a dose of 3e14 to 1e16 atoms/cm$^2$. Further aspects include implanting As or P ions for N-type semiconductor contacts, or implanting $BF_2$ for P-type semiconductor contacts. Another aspect includes forming each of the first and second metal layers of a Ni, Ti or NiPt layer over the substrate. Other aspects include annealing the first and second metal layers and the first and second a-Si capping layers at 400 to 700° C. Further aspects include annealing the first and second metal layers and the first and second a-Si capping layers for 20 to 120 seconds.

Yet another aspect includes a method forming a metal layer directly on a bulk substrate; forming an a-Si capping layer over the metal layer with chemical vapor deposition (CVD); implanting ions at an energy of 3 to 10 keV and a dose of 3e14 to 1e16 atoms/cm$^2$ to induce athermal migration of the a-Si capping layer into the metal layer; and annealing the metal layer and the a-Si capping layer at 400 to 700° C. for 20 to 120 seconds to form a metal silicide layer over the bulk substrate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased contact resistance on smaller surfaces of semiconductor devices in the 28 nm technology node and beyond. In accordance with embodiments of the present disclosure, a novel approach is provided for producing a low resistive metal-Si or metal-SiGe contact with increased transistor performance.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
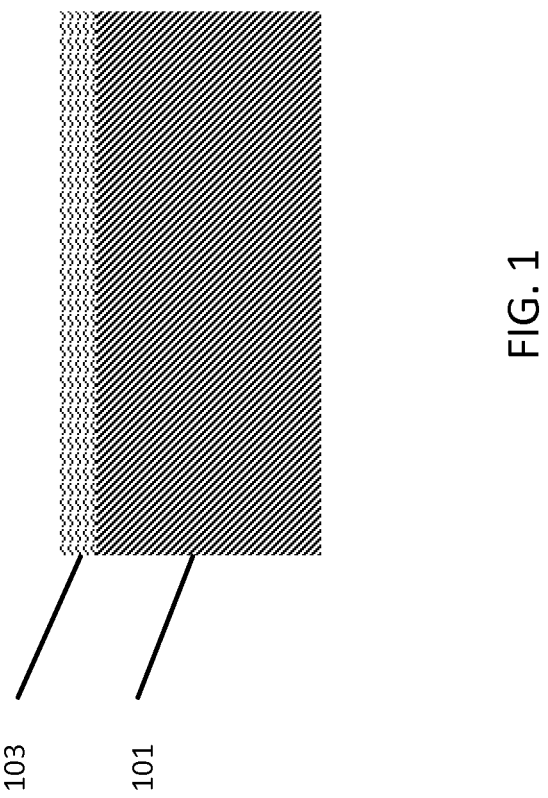
FIGS. 1 through 5 illustrate, in cross sectional view, a process flow to produce a metal-Si contact, in accordance with an exemplary embodiment.

Adverting to FIG. 1, a substrate 101 is shown. Substrate 101 can include a bulk Si substrate. Other examples of materials that may be suitable for use in the substrate 101 include silicon-on-insulator (SOI), SiGe, Ge, and/or compound semiconductor materials.

As shown in FIG. 1, a metal layer 103 is deposited on an upper surface of the substrate 101. The substrate 101 is cleaned prior to depositing the metal layer 103. The metal can be Ni, Ti or NiPt. The metal 103 is deposited by a technique including sputtering, CVD, electroless-plating or electro-plating.

Figure 2:
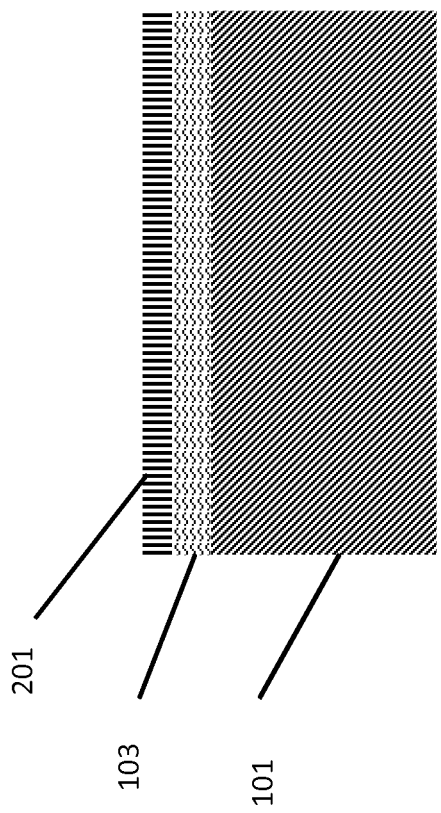

Adverting to FIG. 2, an a-Si capping layer 201 is deposited over the metal layer 103. The a-Si capping layer 201 is deposited with a PECVD process. The a-Si capping layer 201 is the non-crystalline form of Si. The metal layer 103 and the a-Si capping layer 203 are formed to a combined thickness of 1 to 5 nm.

Figure 3:
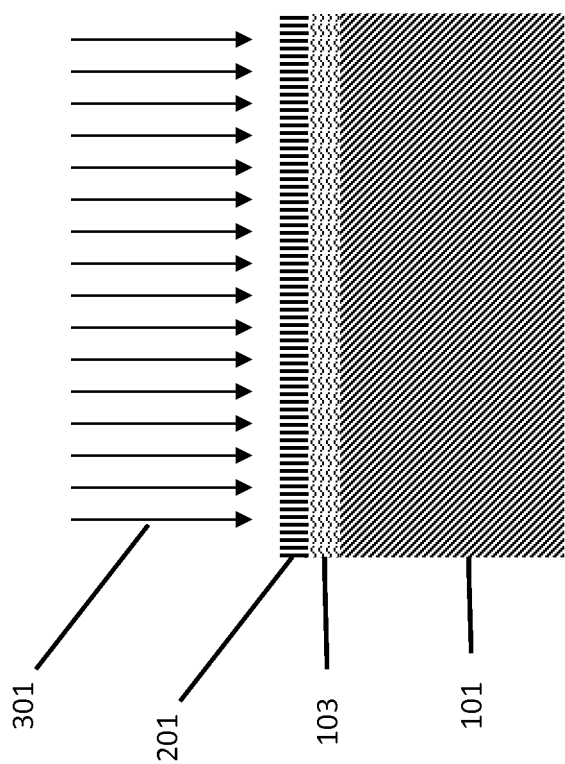

In FIG. 3, an ion implantation step is performed. Ions are implanted to induce an athermal migration or mixing of the a-Si capping layer 201 into the metal layer 103. Ions including Ge, $GeF_2$ or Si can be implanted as general purpose ions. Otherwise As or P ions for N-type semiconductor contacts, or $BF_2$ for P-type semiconductor contacts. The ions are implanted at an energy of 3 to 10 keV and a dose of 3e14 to 1e16 atoms/$cm^2$. The amorphization through the metal layer 103 capped with the a-Si capping layer 201 will induce athermal mixing prior to a thermal annealing process. The ion implantation intermixes the layers which facilitate the silicidation during thermal annealing. In certain embodiments, the implanting of Ge ions into the a-Si it is detectable by secondary ion mass spectrometry (SIMS).

Figure 4:
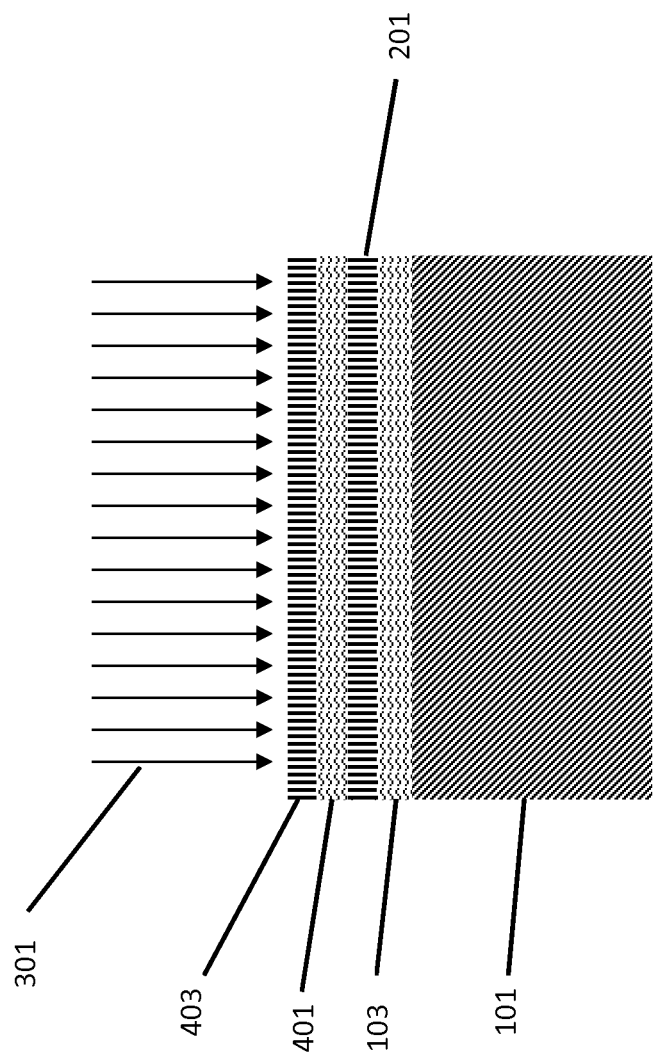

An alternative embodiment is shown in FIG. 4. Multiple metal layers and a-Si capping layers are formed over the substrate. A second metal layer 401 is deposited over the a-Si capping layer 201. A second a-Si capping layer 403 is deposited over the second metal layer 401 prior to implanting the ions 301. The second metal layer 401 and second a-Si capping layer 403 are formed with the same processes as discussed above with respect to the first metal layer 103 and the a-Si capping layer 201. The second metal layer 401 includes Ni, Ti, or NiPt.

Figure 5:
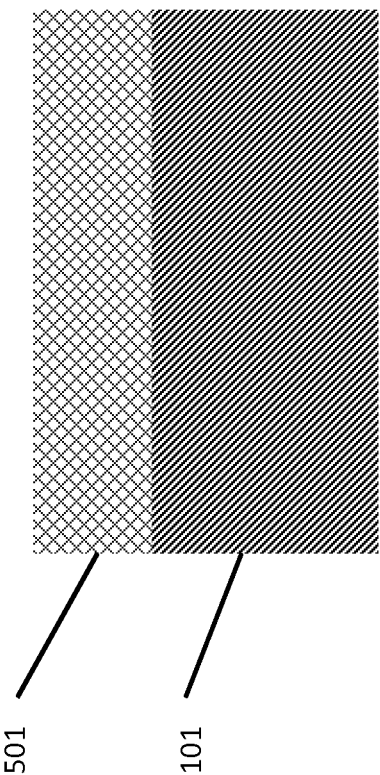

Adverting to FIG. 5, a thermal annealing is performed. The one or more metal layers and the one or more a-Si capping layers are subjected to thermal annealing to form a metal silicide layer 501 over the substrate. In other words, following the ion implantation step in FIG. 3, the metal layer 103 and the a-Si capping layer 201 are subjected to thermal annealing to form metal silicide layer 501. Similarly, following the ion implantation step in FIG. 4, the metal layers 103 and 401 and the a-Si capping layers 201 and 402 are subjected to thermal annealing to form metal silicide layer 501.

Any remaining portion of the metal layer(s) which was not converted into the metal silicide 501 during the thermal annealing process (i.e. was unreacted) is removed by etching or the like. The thermal annealing is performed at a temperature of 400 to 700° C. for 20 to 120 seconds. The metal silicide 501 extends into the substrate 101 during the thermal annealing below the point where the bottom surface of the first metal layer 103 is formed on the substrate 101.

A cross-sectional transmission electron microscopy (X-TEM) can be performed to detect the stacked metal-Si layers over elevated regions of a source/drain (not shown). An amorphous-crystalline border line will remain following the ion implantation within the silicide layer which can be detected by the X-TEM.

SIMS is a technique used to analyze the composition of solid surfaces and thin films. A SIMS inspection can be performed to confirm the implanted species profile at the contact side.

The embodiments of the present disclosure can achieve several technical effects, including lowering the silicidation thermal budget by mixing of the metal and Si semiconductor material through amorphization and lowering the resistance of the layers at the contact site. Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices in the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a metal layer over a substrate;
forming an amorphous silicon (a-Si) capping layer over the metal layer;
forming a second metal layer over the a-Si capping layer, wherein the second metal layer comprises Ni, Ti, or NiPt;
forming a second a-Si capping layer over the second metal layer;
implanting ions to induce an athermal migration of the a-Si capping layer into the metal layer; and
annealing the metal layer and the a-Si capping layer to form a metal silicide layer over the substrate.

2. The method according to claim 1, further comprising:
removing any remaining portion of the metal layer which was not converted into the metal silicide during annealing.

3. The method according to claim 1, wherein the substrate is a bulk Si substrate comprising Si, silicon germanium (SiGe) or germanium (Ge).

4. The method according to claim 1, comprising:
implanting Ge, germanium difluoride ($GeF_2$), or Si at an energy of 3 to 10 kilo electron volts (keV) and a dose of 3e14 to 1e16 atoms/cm$^2$.

5. The method according to claim 1, comprising:
implanting arsenide (As) or phosphorus (P) ions for N-type semiconductor contacts, or
implanting difluoroboryl ($BF_2$) for P-type semiconductor contacts.

6. The method according to claim 1, comprising:
forming a nickel (Ni), titanium (Ti) or nickel platinum (NiPt) layer over the substrate.

7. The method according to claim 1, comprising:
forming the a-Si capping layer with plasma-enhanced chemical vapor deposition (PECVD).

8. The method according to claim 1, comprising:
annealing the metal layer and the a-Si capping layer at 400 to 700° C.

9. The method according to claim 8, comprising:
annealing the metal layer and the a-Si capping layer for 20 to 120 seconds.

10. The method according to claim 1, comprising forming the metal layer and the a-Si capping layer to a combined thickness of 1 to 5 nanometers (nm).

11. A method comprising:
forming a first metal layer over a substrate;
forming a first amorphous silicon (a-Si) capping layer over the first metal layer;
forming a second metal layer over the first a-Si capping layer;
forming a second a-Si capping layer over the second metal layer;
implanting ions to induce an athermal migration of the first and second a-Si capping layers into the first and second metal layers, respectively; and
annealing the first and second metal layers and the first and second a-Si capping layers to form a metal silicide layer over the substrate.

12. The method of claim 11, wherein the substrate is a bulk Si substrate comprising Si, silicon germanium (SiGe) or germanium (Ge).

13. The method according to claim 11, comprising:
implanting Ge, germanium difluoride ($GeF_2$), or Si at an energy of 3 to 10 kilo electron volts (keV) and a dose of 3e14 to 1e16 atoms/cm$^2$.

14. The method according to claim 11, comprising:
implanting arsenide (As) or phosphorus (P) ions for N-type semiconductor contacts, or implanting difluoroboryl ($BF_2$) for P-type semiconductor contacts.

15. The method according to claim 11, comprising:
forming each of the first and second metal layers of a nickel (Ni), titanium (Ti) or nickel platinum (NiPt) layer over the substrate.

16. The method according to claim 11, comprising:
annealing the first and second metal layers and the first and second a-Si capping layers at 400 to 700° C.

17. The method according to claim 16, comprising:
annealing the first and second metal layers and the first and second a-Si capping layers for 20 to 120 seconds.

* * * * *